(12) United States Patent
Lu et al.

(10) Patent No.: US 9,620,445 B1
(45) Date of Patent: Apr. 11, 2017

(54) CHIP PACKAGE STRUCTURE AND METHOD OF MANUFACTURING THE SAME

(71) Applicant: ChipMOS Technologies Inc., Hsinchu (TW)

(72) Inventors: Tung-Bao Lu, Hsinchu (TW); Tzu-Han Hsu, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 15/091,585

(22) Filed: Apr. 6, 2016

(30) Foreign Application Priority Data

Nov. 19, 2015 (TW) .............................. 104138192 A

(51) Int. Cl.
  H01L 23/06  (2006.01)
  H01L 23/48  (2006.01)
  H01L 23/34  (2006.01)
  H01L 21/8222 (2006.01)
  H01L 21/20  (2006.01)
  H01L 23/498 (2006.01)
  H01L 23/64  (2006.01)
  H01L 21/48  (2006.01)

(52) U.S. Cl.
  CPC ........ H01L 23/49811 (2013.01); H01L 21/48 (2013.01); H01L 21/4853 (2013.01); H01L 23/49805 (2013.01); H01L 23/64 (2013.01)

(58) Field of Classification Search
  CPC .......... H05K 1/182; H05K 1/188; H05K 3/30; H05K 3/301; H01L 21/50; H01L 21/70; H01L 21/82; H01L 2021/60067; H01L 2021/60082; H01L 2021/6027; H01L 24/06; H01L 24/09; H01L 24/12; H01L 24/15; H01L 24/93–24/95

USPC ....... 257/678, 684, 686, 690, 693, 707, 713, 257/723, 724; 438/106–108, 329, 330, 438/381, 384
  See application file for complete search history.

(56) References Cited

U.S. PATENT DOCUMENTS 5,710,068 A   1/1998  Hill
7,245,011 B2 * 7/2007  Liu .................... H01L 23/564
                                          257/678

FOREIGN PATENT DOCUMENTS

TW          I227939          2/2005

OTHER PUBLICATIONS

"Office Action of Taiwan Counterpart Application", issued on Aug. 5, 2016, p. 1-p. 7.

\* cited by examiner

*Primary Examiner* — Hsien Ming Lee
(74) *Attorney, Agent, or Firm* — Jianq Chyun IP Office

(57) ABSTRACT

A chip package structure including a chip, a circuit layer, a passive element material and a substrate is provided. The circuit layer is disposed on a surface of the chip, wherein the circuit layer includes a plurality of bumps and a plurality of passive element electrodes. The bumps and the passive element electrodes have the same material, and the passive element electrodes are electrically connected with part of the bumps. The passive element material is disposed between the passive element electrodes, so that the passive element electrodes and the passive element material form a passive element located on the surface of the chip. The chip is disposed on the substrate and faces the substrate by the surface, so that the chip and the passive element are electrically connected to the substrate through the bumps. A method of manufacturing the chip package structure aforementioned is also provided.

20 Claims, 2 Drawing Sheets

CHIP PACKAGE STRUCTURE AND METHOD OF MANUFACTURING THE SAME

CROSS-REFERENCE TO RELATED APPLICATION

This application claims the priority benefit of Taiwan application serial no. 104138192, filed on Nov. 19, 2015. The entirety of the above-mentioned patent application is hereby incorporated by reference herein and made a part of this specification.

BACKGROUND

Field of the Invention

The invention generally relates to a package structure and a method of manufacturing the same, and in particular, to a chip package structure and a method of manufacturing the same.

Description of Related Art

In recent years, with the demand for electronic products toward high functionality, high-speed signal transmission and high-density circuit elements, semiconductor-related industries are also developing increasingly. Take the semiconductor wafer for instance, after the semiconductor wafer is made to be with the conductive structure and form a chip package structure, it can be used in electronic products with electronic circuit function. In addition, the chip package structure can be paired with passive elements to increase its operating efficiency.

Generally, in the chip package structure, the chip and the carrier (such as the circuit substrate) may be used with wires bonding, bumps bonding, leads bonding, etc. to achieve the purpose of electrical connection. The electrical connection (such as bumps) may be formed on the surface of the chip and further connected to the corresponding contacts of the carrier when the chip is disposed on the carrier. Similarly, the passive element of the chip package structure may also be further disposed on the carrier through the applicable way (such as welding). In this way, the usage area of the carrier is not only increasing but also not conducive to streamlined electronic product volume and also increase the overall cost relatively.

SUMMARY

The invention provides a chip package structure and a method of manufacturing the same which change the arrangement of the passive elements such that the chip package structure has the better operational effectiveness.

The invention provides a chip package structure including a chip, a circuit layer, a passive element material and a substrate is provided. The circuit layer is disposed on a surface of the chip, wherein the circuit layer includes a plurality of bumps and a plurality of passive element electrodes. The bumps and the passive element electrodes have the same material, and the passive element electrodes are electrically connected with part of the bumps. The passive element material is disposed between the passive element electrodes, so that the passive element electrodes and the passive element material form a passive element located on the surface of the chip. The chip is disposed on the substrate and faces the substrate by the surface, so that the chip and the passive element are electrically connected to the substrate through the bumps, and the passive element and the bumps are disposed between the chip and the substrate.

The invention provides a method of manufacturing a chip package structure includes: forming a circuit layer on a surface of a chip, wherein the circuit layer includes a plurality of bumps and a plurality of passive element electrodes, and the bumps and the passive element electrodes have the same material, and the passive element electrodes are electrically connected with part of the bumps; coating a passive element material between the passive element electrodes, so that the passive element electrodes and the passive element material form a passive element located on the surface of the chip; and disposing the chip on a substrate and faces the substrate by the surface, so that the chip and the passive element are electrically connected to the substrate through the bumps, and the passive element and the bumps are disposed between the chip and the substrate.

The invention provides a chip package structure including a chip, a circuit layer, a passive element material and a substrate is provided. The circuit layer is disposed on a surface of the chip, wherein the circuit layer includes a plurality of bumps and a plurality of passive element electrodes. The bumps and the passive element electrodes of the circuit layer are formed through a plating process in the same step on the surface of the chip, and the passive element electrodes are electrically connected with part of the bumps. The passive element material is disposed between the passive element electrodes, so that the passive element electrodes and the passive element material form a passive element located on the surface of the chip. The chip is disposed on the substrate and faces the substrate by the surface, so that the chip and the passive element are electrically connected to the substrate through the bumps, and the passive element and the bumps are disposed between the chip and the substrate.

In an embodiment of the invention, wherein the surface of the chip has an active area and a surrounding area disposed around the active area, and the bumps are disposed at the surrounding area, and the passive element electrodes are connected to part of the bumps and extended from the surrounding area to the active area, so that the passive element formed by the passive element electrodes and the passive element material is disposed at the active area.

In an embodiment of the invention, the chip package structure further comprises a bottom metal layer disposed between the surface of the chip and the circuit layer, and the contour of the bottom metal layer is corresponding to the contours of the bumps and the passive element electrodes.

In an embodiment of the invention, wherein the passive element electrodes comprise two strip electrodes disposed opposite from each other, and the passive element material is disposed between the strip electrodes.

In an embodiment of the invention, wherein the passive element electrodes comprise two comb electrodes arranged alternately from each other, and the passive element material is disposed between the comb electrodes.

In an embodiment of the invention, wherein the passive element comprises a capacitance element, a resistance element or an inductance element.

In an embodiment of the invention, wherein the passive element material comprises a dielectric ceramic material, a resistor paste or an inductance paste.

In an embodiment of the invention, wherein the capacitance value of the capacitance element is nano-farad (nF) level.

In an embodiment of the invention, wherein the material of the circuit layer comprises gold, silver, copper or an alloy of the aforementioned materials.

In an embodiment of the invention, wherein the bumps and the passive element electrodes of the circuit layer have the same thickness.

In an embodiment of the invention, wherein the thickness of the circuit layer is between 10 micro meter (μm) and 15 μm.

In an embodiment of the invention, wherein the bumps and the passive element electrodes of the circuit layer are forming in the same step.

In an embodiment of the invention, wherein the method of manufacturing chip package structure further comprises: forming a bottom metal layer between the surface of the chip and the circuit layer, and the contour of the bottom metal layer is corresponding to the contours of the bumps and the passive element electrodes.

In an embodiment of the invention, wherein the method of manufacturing chip package structure further comprises: low-temperature sintering the passive element material coated between the passive element electrodes.

In an embodiment of the invention, wherein the bumps and the passive element electrodes have the same material and the same thickness.

Based on the above, in the chip package structure and the method of manufacturing the same provided in the invention, a plurality of bumps and a plurality of passive elements with the same material (which are in different portion of the same circuit layer) are disposed on the surface of the chip, and the passive element material is disposed between the passive element electrodes to form the passive element, and then the chip is disposed on the substrate, so that the chip and the passive element are electrically connected to the substrate through the bumps. Thus, the chip package structure and the method of manufacturing the same provided in the invention change the arrangement of the passive elements such that the chip package structure has the better operational effectiveness.

In order to make the aforementioned and other features and advantages of the invention more comprehensible, several embodiments accompanied with figures are described in detail below.

DESCRIPTION OF THE EMBODIMENTS

Figure 1:
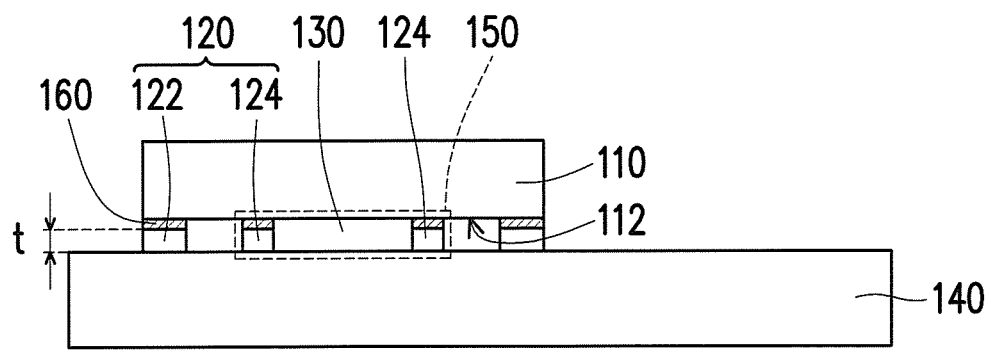
FIG. 1 is a side view illustrating a chip package structure according to an embodiment of the invention.

FIG. 1 is a side view illustrating a chip package structure according to an embodiment of the invention. Referring to FIG. 1, in the embodiment, the chip package structure 100 includes a chip 110, a circuit layer 120, a passive element material 130 and a substrate 140. The circuit layer 120 is disposed on a surface 112 of the chip 110, wherein the circuit layer 120 includes a plurality of bumps 122 and a plurality of passive element electrodes 124. The bumps 122 and the passive element electrodes 124 have the same material and the same thickness t, and the passive element electrodes 124 are electrically connected with part of the bumps 122. Furthermore, the passive element material 130 is disposed between the passive element electrodes 124, so that the passive element electrodes 124 and the passive element material 130 form a passive element 150 located on the surface 112 of the chip 110. Besides, the chip 110 is disposed on the substrate 140 and faces the substrate 140 by the surface 112, so that the chip 110 and the passive element 150 are electrically connected to the substrate 140 through the bumps 122, and the passive element 150 and the bumps 122 are disposed between the chip 110 and the substrate 140. Wherein, FIG. 1 illustrated two bumps 122 and two passive element electrodes 124 is for illustration, but in fact that the number, the arrangement of the bumps 122 and the passive element electrodes 124 and the dimensional ratio such as the thickness or width of each element in the chip package structure 100 can be adjusted according to a design requirement, but it is not limited thereto in FIG. 1. Hereinafter, the structure and the manufacturing methods of the chip package structure 100 of the embodiment will be further described in detail with FIG. 2 and FIG. 3.

Figure 2:
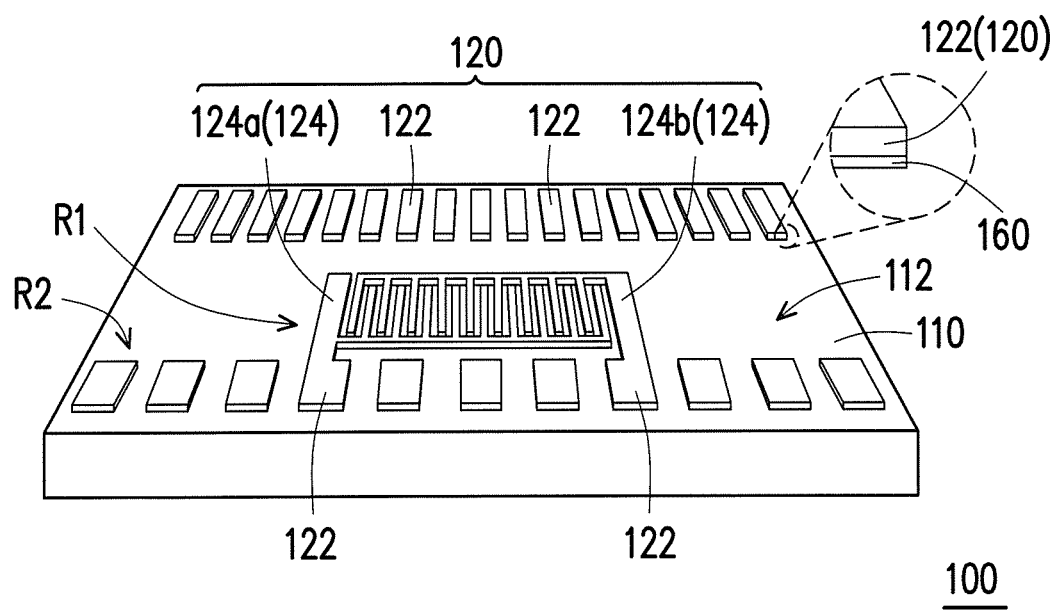
FIGS. 2 and 3 are manufacturing process schematic diagrams illustrating a chip package structure of FIG. 1.
Figure 3:
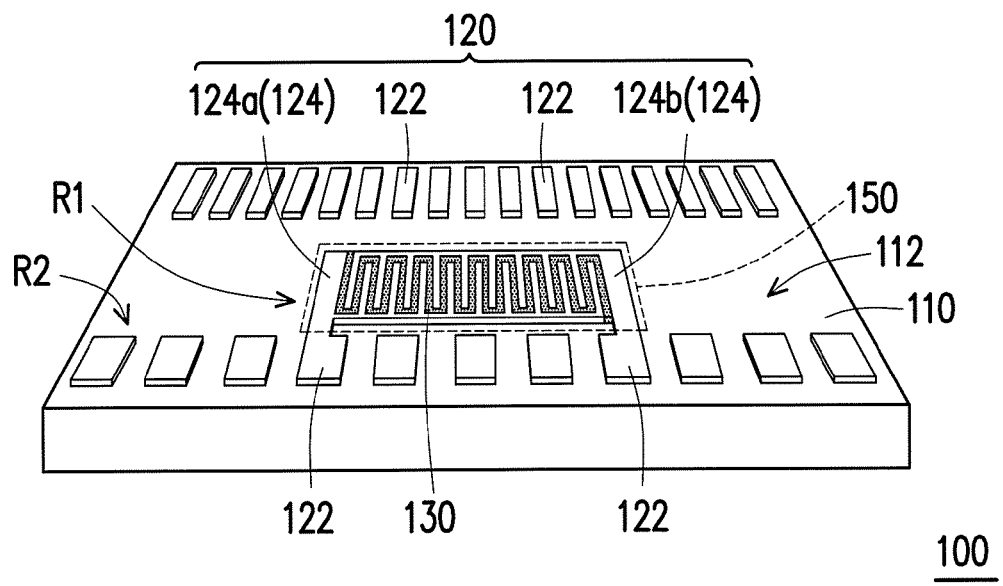

FIGS. 2 and 3 are manufacturing process schematic diagrams illustrating a chip package structure of FIG. 1. In order to more clearly understand the drawings, the substrate 140 depicted in FIG. 1 will be omitted in the chip package structure of FIG. 2 and FIG. 3. Referring to FIG. 1 to FIG. 3, in the embodiment, a method of manufacturing a chip package structure 100 includes as following steps: First, in the embodiment, forming a circuit layer 120 on a surface 112 of a chip 110 (as shown in FIG. 2), wherein the circuit layer 120 includes a plurality of bumps 122 and a plurality of passive element electrodes 124, and the bumps 122 and the passive element electrodes 124 have the same material and the same thickness t, and the passive element electrodes 124 are electrically connected with part of the bumps 122. Still further, the surface 112 of the chip 110 has an active area R1 and a surrounding area R2 disposed around the active area R1, and the bumps 122 are disposed at the surrounding area R2, and the passive element electrodes 124 are connected to part of the bumps 122 and extended from the surrounding area R2 to the active area R1. Therefore, the passive element electrodes 124 and part of the bumps 122 are electrically coupled to each other.

It can be seen, in the embodiment, the bumps 122 and the passive element electrodes 124 are in different portions of the same circuit layer 120, thus the bumps 122 and the passive element electrodes 124 of the circuit layer 120 are framed in the same step and have the same material and the same thickness t. Wherein, the material of the circuit layer 120 includes gold, silver, copper or an alloy of the aforementioned materials, and the thickness t of the circuit layer 120 is between 10 micro meter (μm) and 15 μm, but it is not limited thereto.

Besides, in the embodiment, a method of manufacturing the chip package structure 100 further includes the following step: forming a bottom metal layer 160 between the surface 112 of the chip 110 and the circuit layer 120, and the contour of the bottom metal layer 160 is corresponding to the contours of the bumps 122 and the passive element electrodes 124. In other words, the bottom metal layer 160 may be formed on the surface 112 of the chip 110 according to the requirement before the step of forming the circuit layer 120 on the surface 112 of the chip 110, and then the circuit layer 120 may be formed on the bottom metal layer 160 through a plating process or other suitable processes, such that the bottom metal layer 160 is disposed between the surface 112 of the chip 110 and the circuit layer 120. The bottom metal layer 160 contributes to the forming of the circuit layer 120, where the circuit layer 120 is formed on the surface 112 of the chip 110 disposed with the bottom metal layer 160, such that the contour of the bottom metal layer 160 is almost corresponding to the contours of the circuit layer 120.

Therefore, the chip package structure 100 further includes bottom metal layer 160 disposed between the surface 112 of the chip 110 and the circuit layer 120, and the contour of the bottom metal layer 160 is corresponding to the contours of the bumps 122 and the passive element electrodes 124. However, the arrangement of the bottom metal layer 160 can be adjusted, but it is not limited thereto.

Next, in the embodiment, after the step of the forming the circuit layer 120 on the surface 112 of the chip 110, coating the passive element material 130 between the passive element electrodes 124 (as shown in FIG. 3), and further low-temperature sintering the passive element material 130 coated between the passive element electrodes 124, such that the passive element electrodes 124 and the passive element material 130 form the passive element 150, and the passive element 150 is disposed on the surface 112 of the chip 110. Besides, due to the passive element electrodes 124 are coupled to part of the bumps 122 and extended from the surrounding area R2 to the active area R1, thus the passive element 150 formed by the passive element electrodes 124 and the passive element material 130 is disposed at the active area R1, and the passive element 150 is electrically connected to part of the bumps 122.

Specifically, in the embodiment, the passive element electrode 124 includes two comb electrodes 124a and 124b arranged alternately from each other, and the passive element material 130 is, such as the dielectric ceramic material. The passive element material 130 is coated between the comb electrodes 124a and 124b, and then the passive element electrode 124 and the passive element material 130 form the passive element 150 through low temperature sintering, and the passive element 150 may be a capacitive element, and the capacitance value can be nano-farad (nF) level. Wherein, the dielectric ceramic material, such as ceramic powder, may be a ceramic material with low dielectric constant, such as $TiO_2$, such that the passive element 150 may be NPO type capacitive element, but also may be a ceramic material with medium dielectric constant, such as $BaTiO_3$ or other Barium Ttitanate base ceramic powder, such that the passive element 150 may X7R type capacitive element or Y5V type capacitive element. However, the type of the passive element electrode 124, passive element material 130, and passive element 150 can be adjusted according to the requirement, but it is not limited thereto.

Besides, referring to FIG. 1 and FIG. 3, in the embodiment, after the step of coating the passive element material 130 between the passive element electrodes 124 to form the passive element 150, disposing the chip 110 on the substrate 140 and faces the substrate 140 by the surface 112, so that the chip 110 and the passive element 150 are electrically connected to the substrate 140 through the bumps 122, and the passive element 150 and the bumps 122 are disposed between the chip 110 and the substrate 140. In detail, the substrate 140 is, such as flexible printed circuit board (FPC), but it is not limited thereto. There is a plurality of connection circuits which are not shown on the substrate 140, and the chip 110 is disposed on the substrate 140 through the formed passive element 150 and the surface 112 of the bumps 122 (as shown in FIG. 3) to face the substrate 140, so that the passive element 150 and the bumps 122 are disposed between the chip 110 and the substrate 140, and the chip 110 may be electrically connected to the substrate 140 through the bumps 122. Besides, due to the passive element electrode 124 of the passive element 150 connecting to part of the bumps 122, the passive element 150 may also be electrically connected to the substrate 140 through the bumps 122. In other words, the arrangement of the bumps 122 is almost corresponding to the connecting circuit which is not shown on the substrate 140 for the chip 110 and the passive element 150 may be electrically connected to the substrate 140.

Based on the above, the chip package structure 100 in the embodiment has the passive element 150 formed on the surface 112 of the chip 110, and the circuit for forming the passive element 150 (which means the passive element electrodes 124) and the bumps 122 for connecting between the chip 110 and the substrate 140 are in different portion of the same circuit layer 120, and both of them are formed in the same manufacturing step, and then the passive element material 130 is disposed between the passive element electrodes 124 to form the passive element 150. It can be seen, the passive element 150 is formed on the chip 110 in the embodiment, rather than having a completed existing passive element be disposed on the chip 110. Therefore, the related parameters (such as material) of the passive element 150 may be adjusted during the process of forming the chip package structure 100, so as to increase the operational effectiveness of the passive element 150 accordingly. That is, compared to the related art which makes the capacitive element as a passive element disposed on the substrate 140, the chip package structure 100 in the embodiment has the better operational effectiveness.

Figure 4:
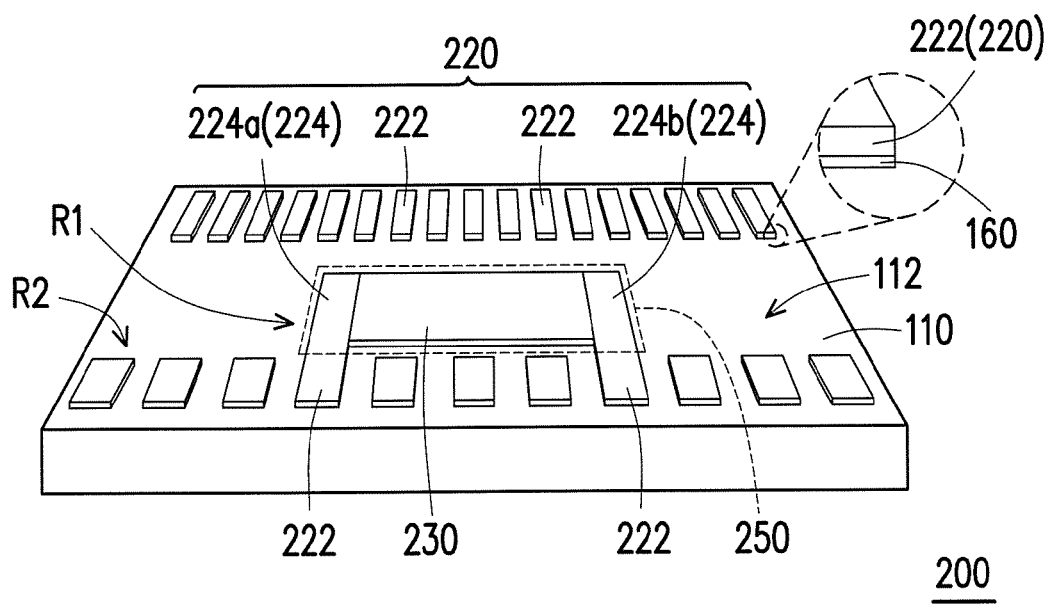
FIG. 4 is a diagram illustrating a chip package structure according to another embodiment of the invention.

FIG. 4 is a diagram illustrating a chip package structure according to another embodiment of the invention. In order to more clearly understand the drawings, the substrate 140 of the chip package structure depicted in FIG. 4 is omitted; however the related instructions of the substrate 140 may refer to FIG. 1 and the foregoing. Referring to FIG. 4, in the embodiment, the chip package structure 200 and the aforementioned chip package structure 100 have the similar structure and practices, the main difference is that the design of the circuit layer 220 and the species of the passive element material 230. Therefore, the circuit layer 220 and the passive element material 230 in the chip package structure 200 are formed on the surface 112 of the chip 110 through the aforementioned process, and after the passive element electrode 224 of the circuit layer 220 and the passive element material 230 are formed as a passive element 250, the chip 110 may be disposed on the substrate 140 and further faces the substrate 140 by the surface 112, such that the chip 110 and the passive element 250 are electrically connected to the substrate 140 through the bumps 222, and the passive element 250 and the bumps 222 are disposed between the chip 110 and the substrate 140, similar to FIG. 1. And, the aforementioned bottom metal layer 160 may be formed between the circuit layer 220 and the surface 112 of the chip 110. Therefore, about the manufacturing methods of the chip 110, substrate 140, bottom metal layer 160, etc. and the manufacturing methods of the chip package structure 200 may refer to the foregoing, thus will not be repeated hereinafter.

Specifically, in the embodiment, the circuit layer 220 of the chip package structure 200 is disposed on the surface 112 of the chip 110, wherein the circuit layer 220 includes bumps 222 and passive element electrodes 224, the bumps 222 and the passive element electrodes 224 have the same material and the same thickness t (referring to a side view of the bumps 122 and the passive element electrodes 124 in FIG. 1), and the passive element electrodes 224 are electrically coupled to part of the bumps 222. Still further, the bumps 222 are disposed around the surrounding area R2, the passive element electrodes 224 are connected to part the bumps 222 and extends from the surrounding area R2 to the active area R1. Therefore, the bumps 222 and the passive element electrodes 224 are in the different portion of the same circuit layer 220, thus the bumps 222 and the passive element electrodes 224 are formed in the same step and has the same material and the same thickness t.

On the other hand, in the embodiment, the main difference between the passive element electrodes 224 and the aforementioned passive element electrodes 124 is that the passive element electrodes 124 include two comb electrodes 124a and 124b arranged alternately from each other, and the passive element electrodes 224 of the embodiment include two strip electrodes 224a and 224b disposed opposite from each other, wherein the two strip electrodes 224a and 224b are connected to part the bumps 222, and the passive element material 230 is disposed between the two strip electrodes 224a and 224b. Therefore, after low-temperature sintering the passive element material 230 coated between passive element electrodes 224, the passive element material 230 and the passive element electrodes 224 form the passive element 250, and the passive element 250 is disposed on the surface 112 of the chip 110 and is electrically connected to part of the bumps 222. Wherein, the passive element material 230 may be resistor paste or inductance paste, such that the passive element 250 may be a resistance element or an inductance element. However, it is not limited to the passive element electrodes 224, passive element material 230 and the type of the passive element 250 composed thereof, which can be adjusted according to a design requirement.

Based on the above, the chip package structure 200 in the embodiment has the passive element 250 to be formed on the surface 112 of the chip 110, and the circuit for forming the passive element 250 (which means the passive element electrodes 224) and the bumps 222 for connecting between the chip 110 and the substrate 140 are in different portion of the same circuit layer 220, both of them are formed in the same manufacturing step, and then the passive element material 230 is disposed between the passive element electrodes 224 to form the passive element 250. Therefore, the related parameters (such as material) of the passive element 250 may be adjusted during the process of forming the chip package structure 200, so as to increase the operational effectiveness of the passive element 250 accordingly, that is the chip package structure 200 of the embodiment has the better operational effectiveness.

Besides, according to the aforementioned embodiment, the chip package structure 100 and 200 may be selected with the type of passive element electrodes 124 and 224 and the passive element material 130 and 230 according to the type of the passive element 150 and 250. Therefore, the manufacturing method may be applicable to form different types of the passive element 150 and 250.

To sum up, the invention provides a chip package structure and a method of manufacturing the same that a plurality of the bumps and a plurality of the passive element electrode with the same material and the same thickness (which are in different portion of the same circuit layer) are disposed on the surface of the chip, and the passive element material is disposed between the passive element electrodes, such that the passive element is formed on the surface of the chip, and then the chip is disposed on the substrate and faces the substrate by the surface, so that the chip and the passive element are electrically connected to the substrate through the bumps. It can be seen, the passive element is formed on the chip in the invention, rather than having a completed existing passive element to be disposed on the chip or the substrate. Thus, the chip package structure and the method of manufacturing the same provided in the invention change the arrangement of the passive elements such that the chip package structure has the better operational effectiveness.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A chip package structure comprising:
a chip;
a circuit layer disposed on a surface of the chip, wherein the circuit layer comprises a plurality of bumps and a plurality of passive element electrodes, and the bumps and the passive element electrodes have the same material, and the passive element electrodes are electrically connected with part of the bumps;
a passive element material disposed between the passive element electrodes, so that the passive element electrodes and the passive element material form a passive element located on the surface of the chip; and
a substrate, wherein the chip is disposed on the substrate and faces the substrate by the surface, so that the chip and the passive element are electrically connected to the substrate through the bumps, and the passive element and the bumps are disposed between the chip and the substrate.

2. The chip package structure according to claim 1, wherein the surface of the chip has an active area and a surrounding area disposed around the active area, and the bumps are disposed at the surrounding area, and the passive element electrodes are connected to part of the bumps and extended from the surrounding area to the active area, so that the passive element formed by the passive element electrodes and the passive element material is disposed at the active area.

3. The chip package structure according to claim 1, further comprise a bottom metal layer disposed between the surface of the chip and the circuit layer, and the contour of the bottom metal layer is corresponding to the contours of the bumps and the passive element electrodes.

4. The chip package structure according to claim 1, wherein the passive element electrodes comprise two strip electrodes disposed opposite from each other, and the passive element material is disposed between the strip electrodes.

5. The chip package structure according to claim 4, wherein the passive element electrodes comprise two comb electrodes arranged alternately from each other, and the passive element material is disposed between the comb electrodes.

6. The chip package structure according to claim 4, wherein the passive element comprises a capacitance element, a resistance element or an inductance element.

7. The chip package structure according to claim 6, wherein the passive element material comprises a dielectric ceramic material, a resistor paste or an inductance paste.

8. The chip package structure according to claim 6, wherein the capacitance value of the capacitance element is nano-farad level.

9. The chip package structure according to claim 1, wherein the material of the circuit layer comprises gold, silver, copper or an alloy of the aforementioned materials.

10. The chip package structure according to claim 1, wherein the bumps and the passive element electrodes of the circuit layer have the same thickness.

11. The chip package structure according to claim 10, wherein the thickness of the circuit layer is between 10 micro meter (μm) and 15 μm.

12. A method of manufacturing chip package structure comprising:
   forming a circuit layer on a surface of a chip, wherein the circuit layer comprises a plurality of bumps and a plurality of passive element electrodes, and the bumps and the passive element electrodes have the same material, and the passive element electrodes are electrically connected with part of the bumps;
   coating a passive element material between the passive element electrodes, so that the passive element electrodes and the passive element material form a passive element located on the surface of the chip; and
   disposing the chip on a substrate and faces the substrate by the surface, so that the chip and the passive element are electrically connected to the substrate through the bumps, and the passive element and the bumps are disposed between the chip and the substrate.

13. The method of manufacturing chip package structure according to claim 12, wherein the bumps and the passive element electrodes of the circuit layer are fainted in the same step.

14. The method of manufacturing chip package structure according to claim 12, wherein the bumps and the passive element electrodes of the circuit layer have the same thickness.

15. The method of manufacturing chip package structure according to claim 12, further comprises:
   forming a bottom metal layer between the surface of the chip and the circuit layer, and the contour of the bottom metal layer is corresponding to the contours of the bumps and the passive element electrodes.

16. The method of manufacturing chip package structure according to claim 12, further comprises:
   sintering the passive element material coated between the passive element electrodes.

17. A chip package structure comprising:
   a chip;
   a circuit layer disposed on a surface of the chip, wherein the circuit layer comprises a plurality of bumps and a plurality of passive element electrodes, and the bumps and the passive element electrodes of the circuit layer are formed through a plating process in the same step on the surface of the chip, and the passive element electrodes are electrically connected with part of the bumps;
   a passive element material disposed between the passive element electrodes, so that the passive element electrodes and the passive element material form a passive element located on the surface of the chip; and
   a substrate, wherein the chip is disposed on the substrate and faces the substrate by the surface, so that the chip and the passive element are electrically connected to the substrate through the bumps, and the passive element and the bumps are disposed between the chip and the substrate.

18. The chip package structure according to claim 17, wherein the surface of the chip has an active area and a surrounding area disposed around the active area, and the bumps are disposed at the surrounding area, and the passive element electrodes are connected to part of the bumps and extended from the surrounding area to the active area, so that the passive element formed by the passive element electrodes and the passive element material is disposed at the active area.

19. The chip package structure according to claim 17, further comprise a bottom metal layer disposed between the surface of the chip and the circuit layer, and the contour of the bottom metal layer is corresponding to the contours of the bumps and the passive element electrodes.

20. The chip package structure according to claim 17, wherein the bumps and the passive element electrodes have the same material and the same thickness.

* * * * *